US010267853B2

(12) United States Patent
Changchien et al.

(10) Patent No.: US 10,267,853 B2
(45) Date of Patent: Apr. 23, 2019

(54) SYSTEM AND METHOD TO DIAGNOSE INTEGRATED CIRCUIT

(71) Applicant: TAIWAN SEMICONDUCTOR MANUFACTURING COMPANY LTD., Hsinchu (TW)

(72) Inventors: Wei-Pin Changchien, Taichung (TW); Hong-Chen Cheng, Hsinchu (TW); Pei-Ying Lin, Pingtung (TW); Hsin-Wu Hsu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 45 days.

(21) Appl. No.: 15/137,833

(22) Filed: Apr. 25, 2016

(65) Prior Publication Data
US 2017/0176525 A1 Jun. 22, 2017

Related U.S. Application Data

(60) Provisional application No. 62/269,712, filed on Dec. 18, 2015.

(51) Int. Cl.
*G06F 17/50* (2006.01)
*G01R 31/00* (2006.01)
(Continued)

(52) U.S. Cl.
CPC ....... *G01R 31/3177* (2013.01); *G01R 31/308* (2013.01); *G06F 17/5081* (2013.01);
(Continued)

(58) Field of Classification Search
CPC ............ G06F 17/5081; G01R 31/3177; G01R 31/308; G06T 7/00
See application file for complete search history.

(56) References Cited

U.S. PATENT DOCUMENTS 8,626,460 B2 * 1/2014 Kaufman ........... G01R 31/2894
324/762.03
8,645,896 B1 * 2/2014 Suri .................... G06F 17/5081
716/136
(Continued)

FOREIGN PATENT DOCUMENTS

TW 200604865 A 2/2006
TW I312929 8/2009

*Primary Examiner* — Stacy Whitmore
(74) *Attorney, Agent, or Firm* — WPAT, P.C., Intellectual Property Attorneys; Anthony King

(57) ABSTRACT

A diagnostic system includes a location extractor, a file generator, and a chip diagnostic tool. The location extractor is arranged to extract at least a coordinate of at least one component in an intellectual property design layout of an integrated circuit design layout according to at least one tagging text labeling the at least one component in the intellectual property design layout. The file generator is arranged to generate a format file according to the at least coordinate. The chip diagnostic tool is arranged to scan a physical intellectual property circuit in a physical integrated circuit to determine a defect component in the physical intellectual property circuit according to the format file. The physical intellectual property circuit corresponds to the intellectual property design layout, and the physical integrated circuit corresponds to the integrated circuit design layout.

20 Claims, 6 Drawing Sheets

(51) Int. Cl.
  *G06T 7/00* (2017.01)
  *G01R 31/3177* (2006.01)
  *G01R 31/308* (2006.01)

(52) U.S. Cl.
  CPC .... *G06T 7/001* (2013.01); *G06T 2207/10061* (2013.01); *G06T 2207/30148* (2013.01)

(56) References Cited

U.S. PATENT DOCUMENTS

| | | | |
|---|---|---|---|
| 2009/0144686 A1* | 6/2009 | Lensing | G06F 17/5081 716/122 |
| 2009/0272982 A1 | 11/2009 | Nakamura et al. | |
| 2010/0332172 A1* | 12/2010 | Kaufman | G01R 31/2894 702/81 |
| 2012/0079439 A1* | 3/2012 | Akar | G11C 29/56008 716/106 |
| 2012/0129301 A1 | 5/2012 | Or-Bach et al. | |
| 2013/0174102 A1* | 7/2013 | Leu | G05B 19/41875 716/52 |

* cited by examiner

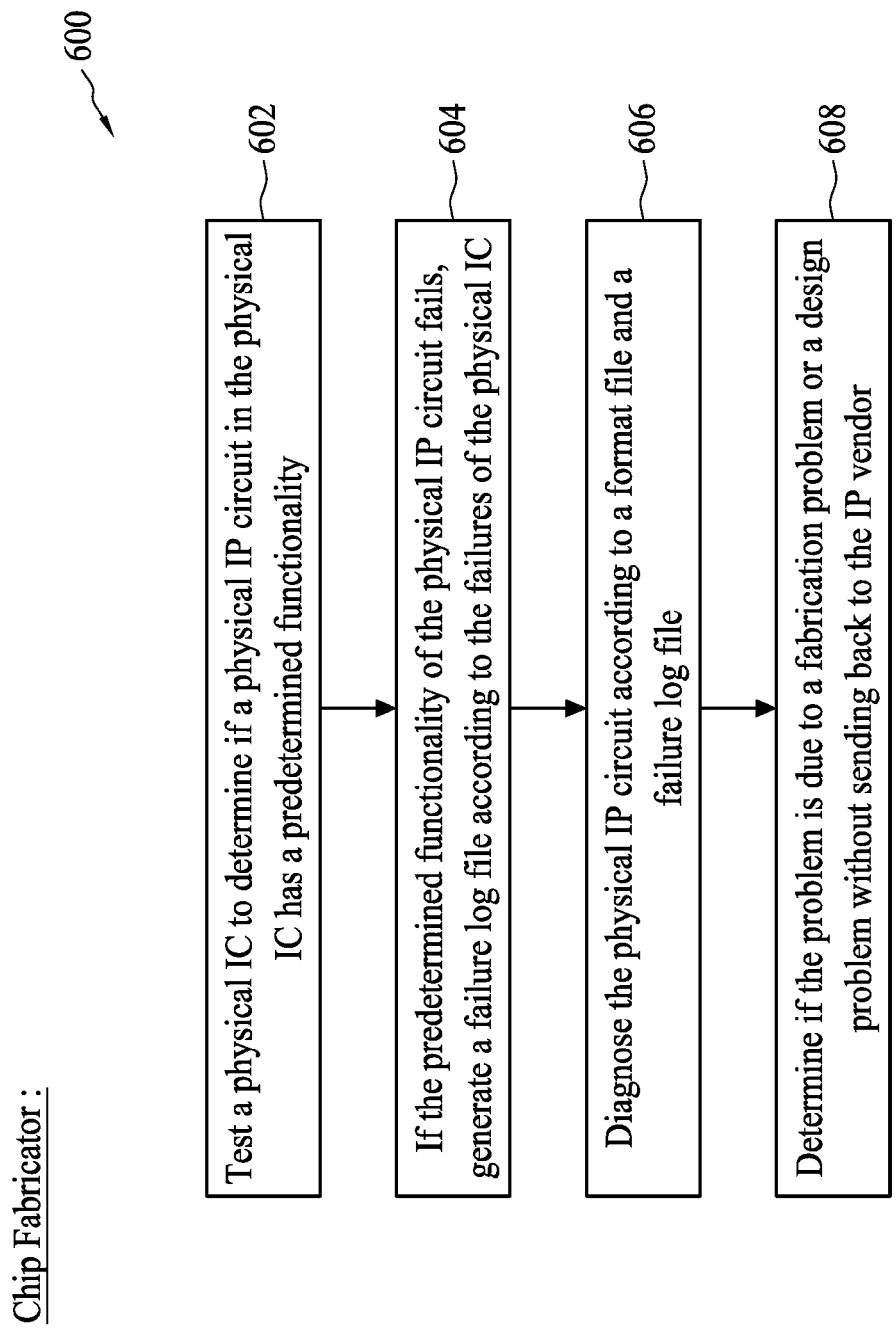

SYSTEM AND METHOD TO DIAGNOSE INTEGRATED CIRCUIT

CROSS REFERENCE TO RELATED APPLICATIONS

This application claims the benefit of U.S. Provisional Application No. 62/269,712, filed Dec. 18, 2015.

BACKGROUND

Currently, an increasing amount of intellectual property (IP) circuits are being integrated into individual chips. The IP circuits may be designed by different IP vendors. When the chip is fabricated by a fabricator, the fabricated chip may undergo a failure analyzing process to determine if failure occurs in the fabricated chip. If failure occurs in one IP circuit, the whole chip may be sent back to the corresponding IP vender to diagnose the failed IP circuit because the fabricator may not have enough information to diagnose the failed IP circuit. The original IP vender may require an extended time to determine the cause of the failure. As a result, the throughput of the fabricator may be severely affected by the efficiency of the IP vendor. Moreover, when the whole chip is sent to an IP vender, the other IP circuits are also exposed to the IP vender, which may result in confidentiality issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flow chart illustrating a method performed upon a physical integrated circuit fabricated by a chip fabricator of FIG. 4 in accordance with some embodiments.

DETAILED DESCRIPTION

Figure 1:
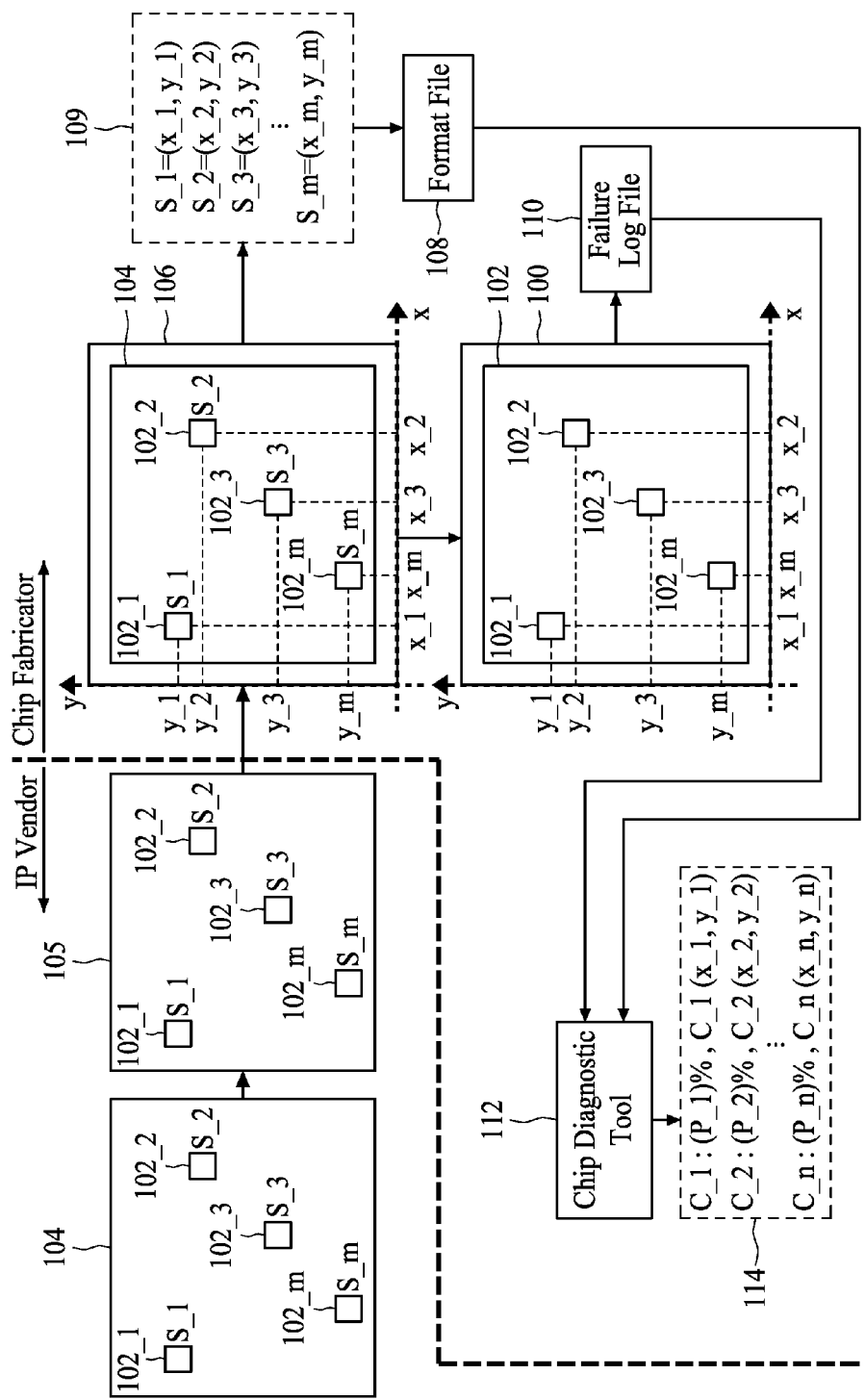
FIG. 1 is a diagram illustrating a process flow to fabricate and diagnose a physical IC in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

In the present disclosure, a process flow of fabricating a semiconductor chip is discussed. In some embodiments, the process flow focuses on, but is not limited to, the diagnostic of a physical integrated circuit (IC). FIG. 1 is a diagram illustrating a process flow to fabricate and diagnose a physical IC 100 in accordance with some embodiments. The physical IC 100 comprises one or more intellectual property (IP) circuits. The process flow generally involves, but is not limited to, two parties, i.e. an IP vendor designing the IP circuit and a chip fabricator fabricating the IC. The physical IC 100 may comprise a plurality of IP circuits, and the plurality of IP circuits may be designed by different IP vendors respectively. The chip fabricator may be a semiconductor foundry. According to some embodiments, for brevity, the physical IC 100 comprises only one physical IP circuit 102.

For testing purposes, the physical IP circuit 102 may comprise a plurality of scan components or scan cells. The plurality of scan components may not be enabled during the normal operation of the physical IP circuit 102. The plurality of scan components are designed to verify the predetermined functionality of the physical IP circuit 102 after the physical IP circuit 102 is fabricated. The plurality of scan components may be conducted to a plurality of pins on the surface of the physical IP circuit 102 respectively. Therefore, the plurality of scan components may be the design-for-test (DFT) components of the physical IP circuit 102. Normally, only the IP vendor knows the physical positions of the plurality of scan components or the physical positions of the plurality of pins conducting to the plurality of scan components respectively. The fabricator may not need to know the physical positions of the plurality of scan components or the physical positions of the plurality of pins. However, according to some embodiments, the fabricator can identify the physical positions of the plurality of scan components or the physical positions of the plurality of pins in the physical IP circuit 102 by using the present method performed upon the IC design layout of the physical IC 100.

As illustratively shown in FIG. 1, when the IP design layout 104 of the physical IP circuit 102 is designed, the IP vendor may label the plurality of scan components 102_1-102$_{13}$_m (or the plurality of pins conducting the plurality of scan components respectively) by a plurality of tagging texts S_1-S_m respectively. According to some embodiments, the naming of the plurality of tagging texts follows a predetermined scanning sequence of the plurality of scan components 102_1-102_m. For example, when the physical IP circuit 102 is fabricated and is tested by inputting a testing signal into the plurality of scan components 102_1-102_m, the plurality of scan components 102_1-102_m react to the testing signal by following the predetermined scanning sequence. Then, the IP vendor transforms the IP design layout 104 into a physical description file 105, e.g. graphic database system (GDS) file or GDSII file. The physical description file 105 is a binary file format representing planar geometric shapes, text labels, and other information about the IP design layout 104 in hierarchical form. Accordingly, the information of the plurality of tagging texts S_1-S_m is included in the physical description file 105.

Then, the physical description file 105 of the physical IP circuit 102 is sent to the chip fabricator. The chip fabricator unfolds or decrypts the physical description file 105 and places the IP design layout 104 into a predetermined location of an IC design layout 106 corresponding to the physical IC 100. In some embodiments, the IC design layout 106 may comprise a plurality of different IP design layouts provided by different IP vendors respectively. The different IP design layouts are placed into a plurality of predetermined locations of the IC design layout 106. Each IP design layout comprises a plurality of scan components. The scan components in each IP design layout are named by a plurality of tagging texts respectively. The order of the tagging texts in each IP design layout is named in accordance with a predetermined scanning sequence. When all IP design layouts are placed into the IC design layout 106, the chip fabricator may extract all tagging texts and the corresponding coordinates of the tagging texts in the IC design layout 106. The coordinates of the tagging texts may be measured under the Cartesian coordinate system with x-axis and y-axis as shown in FIG. 1. Then, the chip fabricator may need to sort all the tagging texts extracted from all IP design layouts in the IC design layout 106. In some embodiments, the chip fabricator sorts all tagging texts of all scan components in the IC design layout 106 to generate a plurality of sorted coordinates when the different IP design layouts are placed into the IC design layout 106. The chip fabricator may one-by-one select the IP design layouts in the IC design layout 106 according to a predetermined order, and one-by-one extract the tagging texts in the IP design layouts. When all tagging texts and the corresponding coordinates of tagging texts of all IP design layouts are extracted, the chip fabricator may refer the predetermined order to sort all tagging texts to generate a plurality of sorted coordinates (e.g. 109 in FIG. 1) of the IC design layout 106. The plurality of sorted coordinates are used to generate a format file (e.g. 108) corresponding to the IC design layout 106. The format file may be used to diagnose the fabricated IC (e.g. the physical IC 100) corresponding to the IC design layout 106. As well known by those skill in the art, the chip fabricator may use a processor or a computer to perform the operations of extracting the coordinates of the tagging texts and generating the format file.

For brevity, only one IP design layout 104 is integrated into the IC design layout 106 in FIG. 1. When the IC design layout 106 is generated, the chip fabricator extracts the plurality of tagging texts S_1-S_m in the IP design layout 104 and determines a plurality of coordinates (x_1, (x_m, y_m) of the plurality of tagging texts S_1-S_m on the IC design layout 106 respectively. For illustration, the x-axis and y-axis are also shown in FIG. 1. According to some embodiments, the coordinates (x_1, y_1)-(x_m, y_m) are the real coordinates of the scan components 102_1-102_m on the physical IC 100 respectively. As described in the above paragraph, the chip fabricator may sort the plurality of coordinates (x_1, y_1)-(x_m, y_m) to generate a plurality of sorted coordinates according to the predetermined scanning sequence of the plurality of scan components 102_1-102_m. In the example of FIG. 1, there has only one IP design layout (i.e. 104) in the IC design layout 106, and the order of the plurality of tagging texts S_1-S_m in the IP design layout 104 have already been sorted by the IP vendor according to the predetermined scanning sequence. Thus, the chip fabricator may directly regard the plurality of coordinates (x_1, y_1)-(x_m, y_m) of the plurality of tagging texts S_1-S_m in the IP design layout 104 as the plurality of sorted coordinates.

When the plurality of coordinates (x_1, y_m) of the plurality of scan components 102_1-102_m on the IC design layout 106 are extracted, the chip fabricator generates a format file 108 corresponding to the IC design layout 106 according to the plurality of coordinates (x_1, y_1)-(x_m, y_m), i.e., the plurality of sorted coordinates 109. According to some embodiments, the format file 108 is a design exchange format (DEF) file recognized by a chip diagnostic tool or a chip testing tool. For example, the format file 108 is readable for an electronic design automation (FDA) software installed in the chip diagnostic tool. However, this is not a limitation. The format file 108 may be some other tool recognized file.

According to some embodiments, the format file 108 not only comprises the plurality of coordinates (x_1, y_1)-(x_m, y_m) of the plurality of scan components 102_1-102_m on the IC design layout 106, but may also comprise other information, such as the function, logical design data, and/or connectivity, of the plurality of scan components 102_1-102_m.

When the format file 108 is generated, the chip fabricator fabricates the IC design layout 106 to generate the physical IC 100, by a semiconductor fabricating process. When the physical IC 100 is fabricated, the physical IC 100 is sent to a testing platform or apparatus to perform the production testing procedure. During the production testing procedure, the physical IC 100 may be in the wafer level or may be cut into a discrete die. The testing platform may use a plurality of wafer probes to test the physical IC 100. If failures or defects occur, the physical IC 100 is diagnosed. Moreover, the testing platform generates a failure log file 110 according to the failures of the physical IC 100. The failure log file 110 records the information, such as the testing pattern, logical input, and/or logical output, related to the failures.

In addition, the chip fabricator also determines if the failures are caused by the physical IP circuit 102 in the physical IC 100. When the failures are caused by the physical IP circuit 102, such as when the functionality of the physical IP circuit 102 is not the predetermined functionality, then the chip fabricator determines that the physical IP circuit 102 has failed. A chip diagnostic tool 112 is used to diagnose the physical IP circuit 102. According to some embodiments, when the physical IC 100 is fabricated, the physical IC 100 is placed on a plane with x-axis and y-axis as shown in FIG. 1. By referring to the x-axis and y-axis, the chip diagnostic tool 112 may determine the physical locations of the plurality of scan components 102_1-102_m of the physical IP circuit 102 according to the plurality of coordinates (x_1, y_1)-(x_m, y_m) in the format file 108. Accordingly, when the chip diagnostic tool 112 receives the failure log file 110, the chip diagnostic tool 112 may directly detect the plurality of scan components 102_1-102_m to determine the failed scan component according to the plurality of coordinates (x_1, y_1)-(x_m, y_m) in the format file 108.

According to some embodiments, the chip diagnostic tool 112 generates a defect report 114 listing the candidate defect component(s) or the pin(s) conducting to the candidate defect component(s) of the physical IP circuit 102. For example, the defect report 114 may list a plurality of candidate defect components C_1-C_n, a plurality of coordinates (x_1, y_1)-(x_n, y_n) corresponding to the plurality of candidate defect components C_1-C_n respectively, and a plurality of defect percentages P_1-P_n (or probabilities) corresponding to the plurality of candidate defect components C_1-C_n respectively. However, this is not a limitation. The defect report 114 may comprise other information relating to the plurality of candidate defect components C_1-C_n in order to ease the chip fabricator to determine the defectiveness of the candidate defect components.

The defect percentage of a component indicates the probability of the defection of the component. According to some embodiments, when a defect percentage of a candidate defect component is about 70%-100%, the chip fabricator may determine the candidate defect component is a failed scan component. When the failed scan component is determined, such as when the physical location of the failed scan component of the physical IP circuit 102 is also determined, then the chip fabricator may observe the exact location, such as under an electron microscope, to quickly determine if the problem is due to a fabrication problem or a design problem without sending back to the IP vendor. The chip fabricator may cut open the physical location of the failed scan component of the physical IP circuit 102 to determine if the problem is due to a fabrication problem or a design problem. As the physical IP circuit 102 is diagnosed in the chip fabricator, the throughput of the physical IC 100 can be fully controlled by the chip fabricator. In addition, as the defected physical IC 100 is not sent back to the original IP vendor, the confidentiality of the other physical IP circuits in the physical IC 100 can be secured.

In FIG. 1, the coordinates of the tagging texts may be measured under the Cartesian coordinate system with x-axis and y-axis. However, this is not a limitation of the present disclosure. Other coordinate systems may be failed within the scope of the present disclosure. For example, the coordinates of the tagging texts may be measured under the Polar coordinate system, wherein a tagging text on the IC design layout 106 is determined by a distance from a reference point and an angle from a reference direction. When the coordinates of the tagging texts are measured under the Polar coordinate system, the chip diagnostic tool 112 also uses the Polar coordinates to determine the physical locations of the plurality of scan components 102_1-102_m of the physical IP circuit 102.

Figure 2:
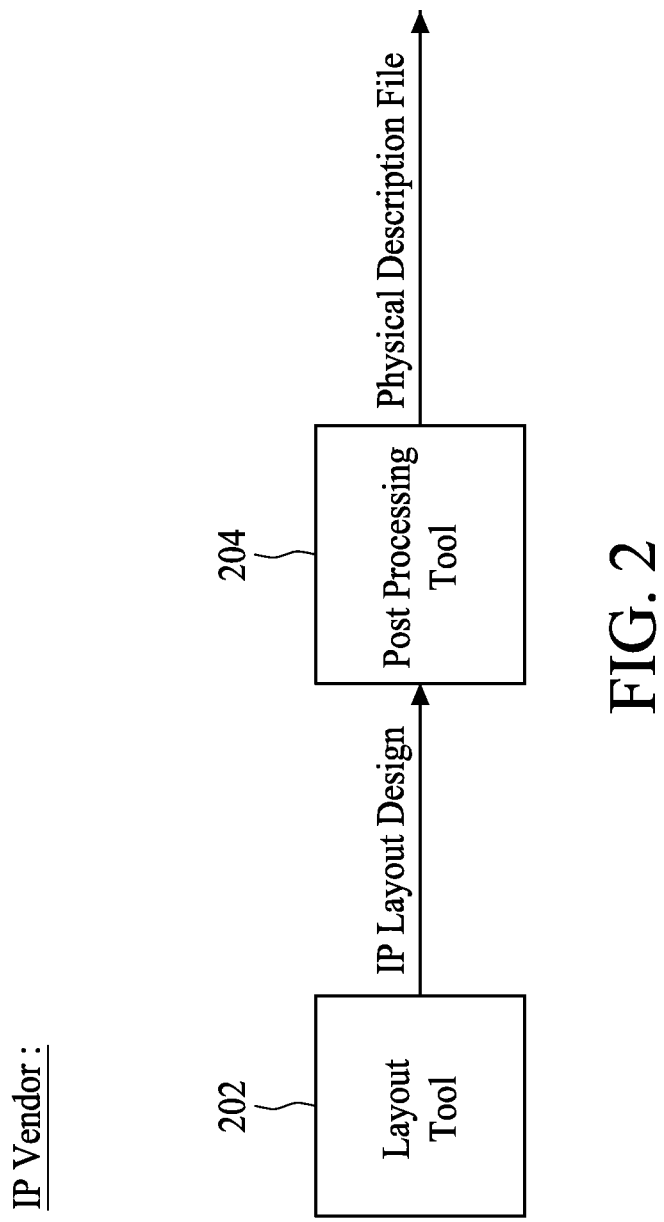
FIG. 2 is a diagram illustrating a designing system for designing the physical IC of FIG. 1 in accordance with some embodiments.

According to the process flow of FIG. 1, the IP vendor provides a designing system to design the IP design layout 104. FIG. 2 is a diagram illustrating the designing system 200 in accordance with some embodiments. The designing system 200 is a computer aided design (CAD) system. The designing system 200 comprises a layout tool 202 and a post processing tool 204. The layout tool 202 is arranged to design the IP design layout 104 corresponding to the physical IP circuit 102. The IP design layout 104 is designed to include the plurality of scan components 102_1-102_m. The plurality of scan components 102_1-102_m may be the design-for-test (DFT) components of the physical IP circuit 102. The layout tool 202 is capable of labeling the plurality of scan components 102_1-102_m by the plurality of tagging texts S_1-S_m respectively. The naming of the plurality of tagging texts S_1-S_m follows the predetermined scanning sequence of the plurality of scan components 102_1-102_m.

According to some embodiments, the plurality of tagging texts S_1-S_m may not be necessary tagged on the plurality of scan components 102_1-102_m respectively. The plurality of tagging texts S_1-S_m may be tagged on a plurality of pins designed on the outer surface of the IP design layout 104 in which the plurality of pins conducts to the plurality of scan components 102_1-102_m respectively.

The post processing tool 204 is capable of converting the IP design layout 104 into the physical description file 105. The physical description file 105 is a standard physical description format file, e.g. the GDSH file. According to some embodiments, the post processing tool 204 converts the IP design layout 104 together with the plurality of tagging texts S_1-S_m into the physical description file 105. Therefore, the information of the plurality of tagging texts S_1-S_m is encrypted into the physical description file 105.

Figure 3:
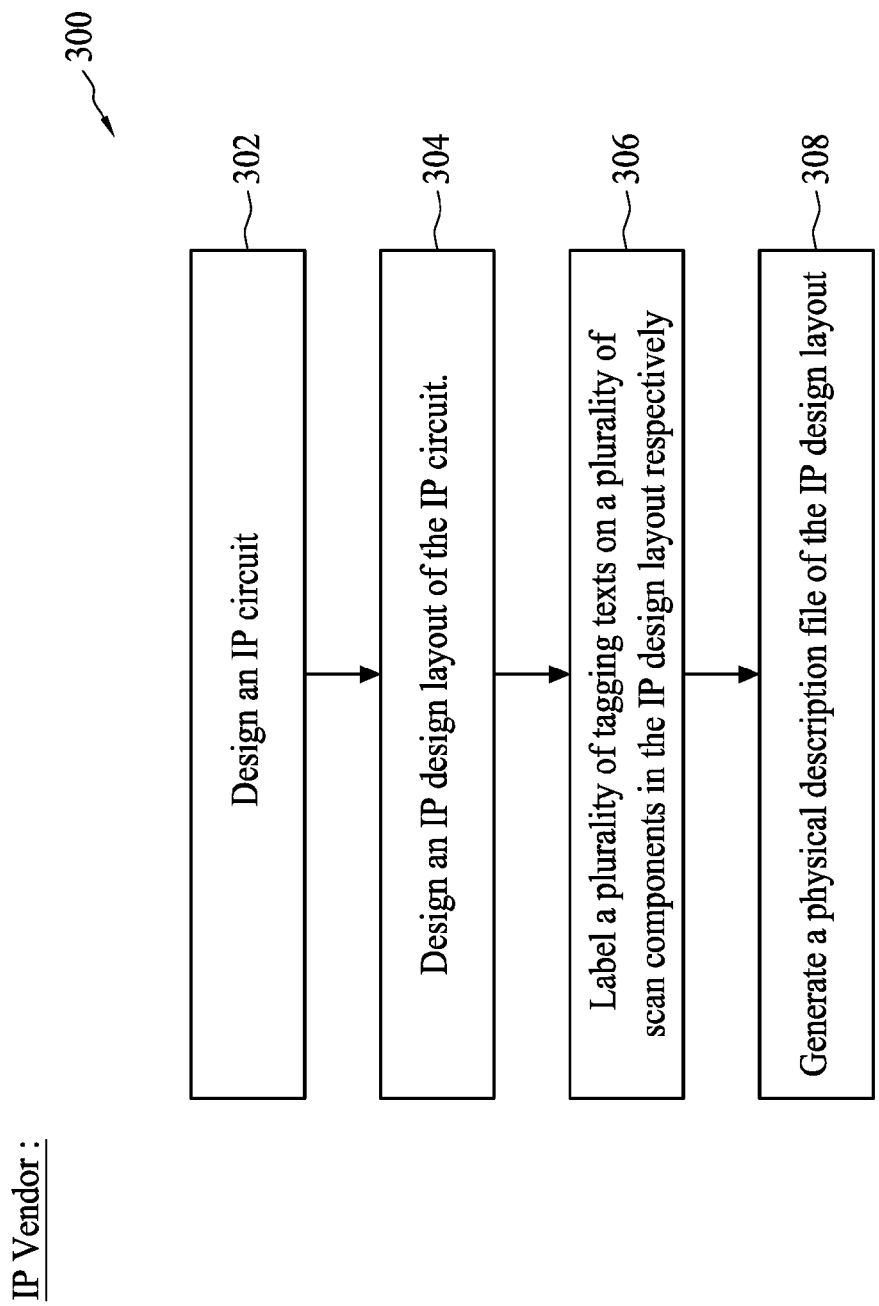
FIG. 3 is a flow chart illustrating a designing method of the designing system of FIG. 2 in accordance with some embodiments.

According to some embodiments, the vendor performs a designing method to generate the physical description file 105 of the physical IP circuit 102. FIG. 3 is a flow chart illustrating the designing method 300 in accordance with some embodiments. The designing method 300 comprises, but is not limited to, operations 302-308. In operation 302, the physical IP circuit 102 in the form of a gate level or netlist level is designed by the IP vendor. The plurality of scan components or scan cells 102_1-102_m is also designed in the IP circuit 102 for the purpose of testing. The plurality of scan components may be the design-for-test (DFT) components of the IP circuit 102.

In operation 304, the IP design layout 104 of the IP circuit 102 is designed by the IP vendor. The plurality of scan components 102_1-102_m is also included in the IP design layout 104.

In operation 306, the plurality of tagging texts S_1-S_m are labeled or tagged on the plurality of scan components 102_1-102_m in the IP design layout 104 respectively. The naming of the plurality of tagging texts S_1-S_m follows the predetermined scanning sequence of the plurality of scan components 102_1-102_m. For example, when the IP circuit 102 is fabricated and is tested by inputting a testing signal into the plurality of scan components 102_1-102_m, the plurality of scan components 102_1-102_m react to the testing signal by following the predetermined scanning sequence. According to some embodiments, the plurality of tagging texts S_1-S_m may also be labeled on a plurality of pins in the IP design layout 104 respectively, in which the plurality of pins conduct to the plurality of scan components 102_1-102_m respectively.

In operation 308, the physical description file 105, e.g. the GDSH file, of the IP design layout 104 is generated by the IP vendor.

In some embodiments, the information of the plurality of tagging texts S_1-S_m corresponding to the plurality of scan components 102_1-102_m are encrypted into the physical description file 105 in the IP vendor side.

Figure 4:
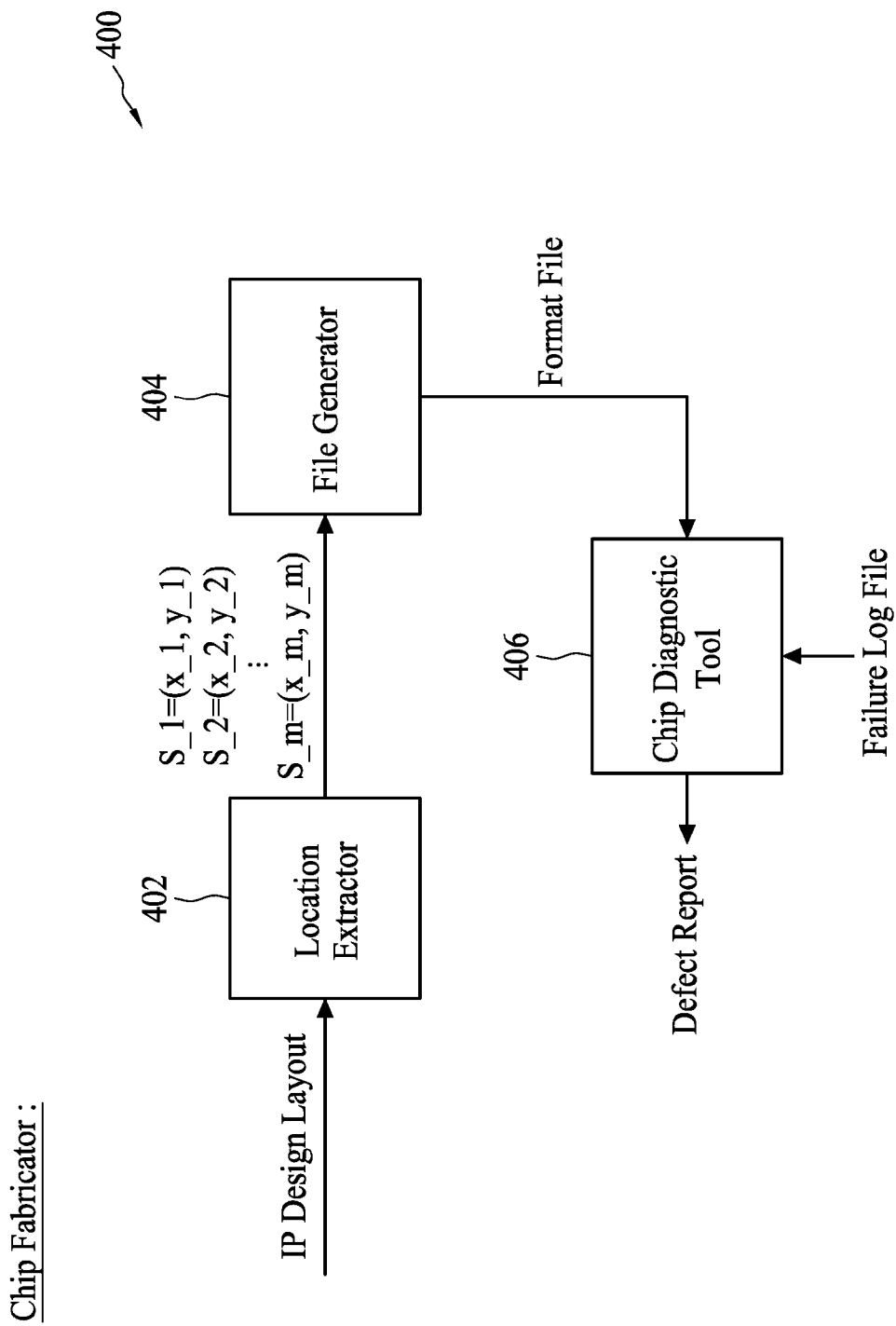
FIG. 4 is a diagram illustrating a diagnostic system for diagnosing the physical IC of FIG. 1 in accordance with some embodiments.

In some embodiments, according to the process flow of FIG. 1, the chip fabricator provides a diagnostic system to diagnose the physical IC 100. FIG. 4 is a diagram illustrating the diagnostic system 400 in accordance with some embodiments. The diagnostic system 400 comprises a location extractor 402, a file generator 404, and a chip diagnostic tool 406. The location extractor 302 is arranged to extract the plurality of coordinates $(x\_1, y\_1)$-$(x\_m, y\_m)$ of the plurality of scan components 102_1-102_m in the IP design layout 104 of the IC design layout 106 according to the plurality of tagging texts S_1-S_m labeling the plurality of scan components 102_1-102_m respectively. The file generator 404 is arranged to generate the format file 108 according to the plurality of coordinates $(x\_1, y\_1)$-$(x\_m, y\_m)$. When the physical IC 100 is fabricated and tested, the chip diagnostic tool 406 is arranged to scan the physical IP circuit 102 in the physical IC 100 to determine a defect component in the physical IP circuit 102 according to the format file 108 and the failure log file 110, wherein the physical IP circuit 102 corresponds to the IP design layout 104, and the physical IC 100 corresponds to the IC design layout 106.

According to some embodiments, the testing procedure of the physical 100 may be performed by a testing platform. The testing platform may be a separated platform or may be integrated into the chip diagnostic tool 406. In some embodiments, the chip diagnostic tool 406 tests the physical IC 100 to determine if the physical IP circuit 102 has a predetermined functionality. If the predetermined functionality of the physical IP circuit 102 fails, the chip diagnostic tool 406 generates the failure log file 110 according to the failures of the physical IC 100.

Then, the chip diagnostic tool 406 scans the physical IP circuit 102 to determine the defect component(s) and the corresponding location of the defect component in the physical IP circuit 100 according to the format file 108 and the failure log file 110. For example, the chip diagnostic tool 406 is arranged to scan the plurality of scan components 102_1-102_m in the physical IP circuit 102 in a predetermined scanning sequence to determine the defect scan component according to the format file 108 and the failure log file 110. The chip diagnostic tool 406 generates the defect report 114 listing the candidate defect component(s) or the pin(s) conducting to the candidate defect component(s) of the physical IP circuit 102. The defect report 114 may list a plurality of candidate defect components C_1-C_n, and a plurality of coordinates $(x\_1, y\_1)$-$(x\_n, y\_n)$ corresponding to the plurality of candidate defect components C_1-C_n respectively, and a plurality of defect percentages or probabilities P_1-P_n corresponding to the plurality of candidate defect components C_-C_n respectively. Then, the chip fabricator determines which one of the candidate defect components is a failed scan component according to the information of the defect report 114. According to some embodiments, the diagnostic system 400 may further comprise a cutting tool to cut open the physical location of the failed scan component of the physical IP circuit 102 for determining if the problem is due to a fabrication or design error.

Figure 5:
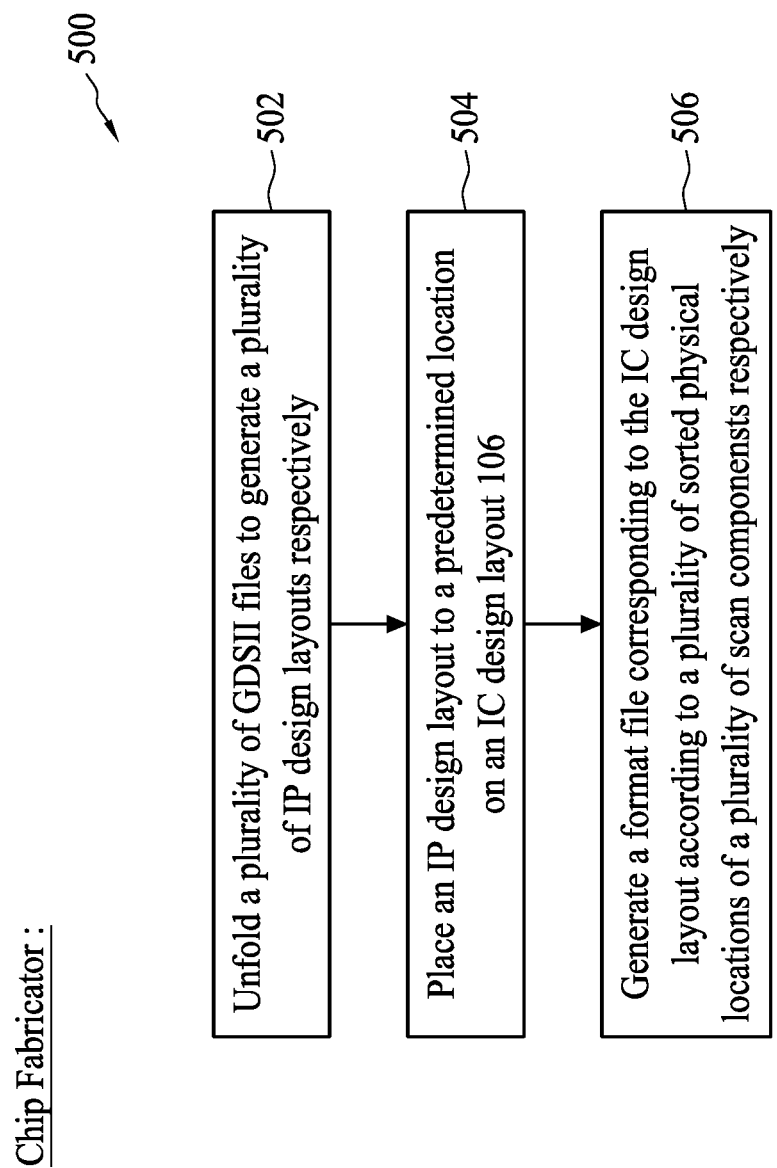
FIG. 5 is a flow chart illustrating a method performed upon an integrated circuit design layout received by a chip fabricator of FIG. 4 in accordance with some embodiments.

In some embodiments, a method is performed upon the IC design layout 106 by the chip fabricator. FIG. 5 is a flow chart illustrating the method 500 performed upon the IC design layout 106 in accordance with some embodiments. The method 500 comprises, but is not limited to, operations 502-506. In operation 502, when the chip fabricator receives a plurality of GDSII files by different IP vendors respectively, the chip fabricator unfolds or decrypts the plurality of GDSII files to generate a plurality of IP design layouts respectively. For brevity, the chip fabricator only receives the GDSII file of the IP design layout 104.

In operation 504, the chip fabricator places the IP design layout 104 to a predetermined location on the IC design layout 106. The chip fabricator also extracts the plurality of tagging texts S_1-S_m in the IP design layout 104 and determines the plurality of coordinates $(x\_1, y\_1)$-$(x\_m, y\_m)$ of the plurality of tagging texts S_1-S_m on the IC design layout 106 respectively. According to some embodiments, the chip fabricator also sorts the plurality of coordinates $(x\_1, y\_1)$-$(x\_m, y\_m)$ to generate a plurality of sorted physical locations according to the predetermined scanning sequence of the plurality of scan components 102_1-102_m.

In operation 506, the chip fabricator generates the format file 108 corresponding to the IC design layout 106 according to the plurality of sorted coordinates $(x\_1, y\_1)$-$(x\_m, y\_m)$. This is not a limitation of. For example, when the IC design layout 106 comprises a plurality of IP design layouts, in which each IP design layout has their own physical locations of scan components, then the fabricator generates the format file according to the plurality of sorted physical locations of the plurality of IP design layouts. According to some embodiments, the format file 108 is a design exchange format (DEF) file recognized by a chip diagnostic tool or a chip testing tool.

Then, the chip fabricator fabricates the IC design layout 106 to generate the physical IC 100 by a semiconductor process. When the physical IC 100 is fabricated, a method is performed upon the physical IC 100 by the chip fabricator. FIG. 6 is a flow chart illustrating the method 600 performed upon the physical IC 100 in accordance with some embodiments. The method 600 comprises, but is not limited to, operations 602-608. In operation 602, the chip fabricator generates the format file 108 corresponding to the physical IC 100. Then, the chip fabricator fabricates and tests the physical IC 100 to determine if any fault occurs. For example, the chip fabricator tests the physical IC 100 to determine if the physical IP circuit 102 in the physical IC 100 has the predetermined functionality.

In operation 604, if the predetermined functionality of the physical IP circuit 102 fails, the chip fabricator generates the failure log file 110 according to the failures of the physical IC 100.

In operation 606, the chip fabricator uses a chip diagnostic tool (e.g. 406) to diagnose the physical IP circuit 102 according to the format file 108 obtained in the operation 506 and the failure log file 110. For example, as the format file 108 comprises the plurality of coordinates $(x\_1, y\_1)$-$(x\_n, y\_n)$ of the plurality of scan components 102_1-102_m of the physical IP circuit 102, the chip fabricator may directly detect the plurality of scan components 102_1-102_m to determine which is the failed scan component. When the failed scan component is determined, the physical location of the failed scan component of the physical IP circuit 102 is also determined.

Then, in operation 608, the chip fabricator may inspect the exact location, such as under an electron microscope, to quickly determine if the problem is due to a fabrication or design error without sending back to the IP vendor.

According to the method 600, the throughput of the chip fabricator may not be affected by the defected IP circuit 102 while the confidentiality of the other physical IP circuits in the physical IC 100 may be secured.

According to some embodiments, the plurality of tagging texts S_1-S_m are pre-tagged on the plurality of scan components 102_1-102_m in the IP vendor side. In the chip fabricator side, the chip fabricator extracts the plurality of tagging texts S_1-S_m from the IP design layout 104 and determines the plurality of coordinates $(x\_1, y\_1)$-$(x\_m,$ y_m) of the plurality of scan components 102_1-102_m respectively. Then, the chip fabricator generates the DEF file of the IC design layout 106 according to the plurality of coordinates (x_1, y_1)-(x_m, y_m). When the physical IC 100 is fabricated and tested, the chip fabricator can diagnose the defect component in the physical IP circuit 102 of the physical IC 100 without sending the physical IC 100 to the IP vendor. Therefore, the throughput of the chip fabricator is not affected by the delay of the IP vendor, and the confidentiality of the other physical IP circuits in the physical IC 100 can be secured.

In some embodiments of the present disclosure, a diagnostic system is disclosed. The diagnostic system comprises a location extractor, a file generator, and a chip diagnostic tool. The location extractor is arranged to extract at least a coordinate of at least one component in an IP design layout of an IC design layout according to at least one tagging text labeling the at least one component in the IP design layout. The file generator is arranged to generate a format file according to the at least coordinate. The chip diagnostic tool is arranged to scan a physical IP circuit in a physical IC to determine a defect component in the physical IP circuit according to the format file. The physical IP circuit corresponds to the IP design layout, and the physical IC corresponds to the IC design layout.

In some embodiments of the present disclosure, a method performed upon an IC design layout is disclosed. The method comprises: placing an IP design layout to a predetermined location of the IC design layout, wherein the IP design layout comprises at least one tagging text labeling at least one component of the IP design layout; determining at least one coordinate of the at least one component according to the at least one tagging text; generating a format file corresponding to the IC design layout according to the at least one component coordinate.

In some embodiments of the present disclosure, a method performed upon a physical IC is disclosed. The method comprises: providing the physical IC comprising a physical IP circuit; providing a format file corresponding to the physical IC; testing the physical IC to determine if the physical IP circuit has a predetermined functionality; if the predetermined functionality of the physical IP circuit fails, scanning the physical IP circuit to determine a defect component in the physical IP circuit according to the format file.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A diagnostic system, comprising:
    a processor, arranged to extract at least a coordinate of at least one scan component in a design layout of an integrated circuit (IC) design layout according to at least one tagging text labeling the at least one scan component in the design layout, and arranged to generate a design exchange format file of the IC design layout according to the at least coordinate; and
    a chip diagnostic tool, having a testing platform, the chip diagnostic tool arranged to scan a physical circuit in a physical IC on the testing platform to determine a defect component in the physical circuit according to the design exchange format file;
    wherein the physical circuit corresponds to the design layout, and the physical IC corresponds to the IC design layout, the at least one scan component comprises a plurality of scan components, the at least on tagging text comprises a plurality of tagging texts, the processor names the plurality of tagging texts based on a predetermined scanning sequence, and the chip diagnostic tool scans the plurality of scan components in the physical circuit by following the predetermined scanning sequence to determine the defect component in the physical circuit according to the design exchange format file.

2. The diagnostic system of claim 1, wherein the design exchange format file comprises the at least coordinate of the at least one scan component in the design layout.

3. The diagnostic system of claim 1, wherein the chip diagnostic tool further tests the physical IC to determine if the physical circuit has a predetermined functionality, if the predetermined functionality of the physical circuit fails, the chip diagnostic tool scans the physical circuit to determine a defect component in the physical circuit according to the design exchange format file.

4. The diagnostic system of claim 3, wherein the chip diagnostic tool further determines a coordinate of the defect component in the physical circuit according to the design exchange format file.

5. The diagnostic system of claim 1, wherein the at least one scan component is designed for testing of the physical circuit.

6. The diagnostic system of claim 5, wherein the IC design layout comprises a plurality of pins conducting to the plurality of scan components respectively, and the plurality of tagging texts are tagged on the plurality of pins respectively.

7. A method performed upon an integrated circuit (IC) design layout, the method comprising:
    placing a design layout to a predetermined location of the IC design layout, wherein the design layout comprises at least one tagging text labeling at least one scan component of the design layout;
    determining at least one coordinate of the at least one scan component according to the at least one tagging text;
    generating a design exchange format file corresponding to the IC design layout according to the at least one coordinate; and
    causing a physical circuit to be fabricated according to the IC design layout;
    wherein the at least one tagging text comprises a plurality of tagging texts, the at least one scan component comprises a plurality of scan components, the at least one coordinate comprises a plurality of coordinates, and the plurality of tagging texts label the plurality of scan components respectively, and the method further comprises:
    sorting the plurality of coordinates of the plurality of scan components to generate a plurality of sorted coordinates according to a predetermined scanning sequence of the plurality of scan components; and
    generating the design exchange format file according to the plurality of sorted coordinates.

8. The method of claim 7, wherein the design exchange format (DEF) file is recognized by a chip diagnostic tool.

9. The method of claim 7, wherein the at least one scan component is designed for testing of the design layout.

10. The method of claim 7, further comprising:
providing a graphic database system (GDS) file corresponding to the design layout;
wherein the at least one tagging text is included in the GDS file.

11. The method of claim 7, wherein generating the design exchange format file corresponding to the IC design layout according to the at least one coordinate comprises:
generating the design exchange format file corresponding to the IC design layout according to the at least one coordinate and at least one functional information of the at least one scan component.

12. The method of claim 7, wherein the IC design layout comprises a plurality of pins conducting to the plurality of scan components respectively.

13. The method of claim 12, wherein the plurality of tagging texts are tagged on the plurality of pins respectively.

14. A method performed upon a physical integrated circuit (IC), the method comprising:
causing the physical circuit to be fabricated according to an IC design layout;
providing the physical IC comprising a physical circuit;
providing a design exchange format file corresponding to the physical IC according to at least one coordinate of at least one scan component having at least one tagging text in the IC design layout;
testing the physical IC to determine if the physical circuit has a predetermined functionality;
if the predetermined functionality of the physical circuit fails, scanning the physical circuit to determine a defect component in the physical circuit according to the design exchange format file;
wherein the at least one scan component comprises a plurality of scan components, the at least one tagging text comprises a plurality of tagging texts, the plurality of tagging texts are named based on a predetermined scanning sequence, and scanning the physical circuit to determine the defect component in the physical circuit according to the design exchange format file comprises:
scanning the plurality of scan components in the physical circuit by following the predetermined scanning sequence to determine the defect component in the physical circuit according to the design exchange format file.

15. The method of claim 14, wherein scanning the physical circuit to determine the defect component in the physical circuit according to the design exchange format file further comprises:
determining a coordinate of the defect component in the physical circuit according to the design exchange format file.

16. The method of claim 14, wherein scanning the physical circuit to determine the defect component in the physical circuit according to the design exchange format file comprises:
using a chip diagnostic tool to scan the physical circuit to determine the defect component in the physical circuit according to the design exchange format file;
wherein the design exchange format file is recognized by the chip diagnostic tool.

17. The method of claim 14, wherein the design exchange format file comprises the at least coordinate of the at least one scan component in the design layout.

18. The method of claim 14, wherein scanning the physical circuit to determine the defect component in the physical circuit according to the design exchange format file comprises:
scanning at least one scan component of the physical circuit to determine the defect component in the physical circuit according to the design exchange format file.

19. The method of claim 18, wherein the at least one scan component is designed for testing of the physical circuit.

20. The method of claim 19, wherein the IC design layout comprises a plurality of pins conducting to the plurality of scan components respectively, and the plurality of tagging texts are tagged on the plurality of pins respectively.

* * * * *